US009065187B2

(12) United States Patent
Leshniak et al.

(10) Patent No.: US 9,065,187 B2
(45) Date of Patent: Jun. 23, 2015

(54) LED CONNECTOR

(71) Applicant: AMERLUX LLC, Fairfield, NJ (US)

(72) Inventors: Itai Leshniak, Fair Lawn, NJ (US); Jonathan Walsh, Pompton Plains, NJ (US); Paresh Shah, Piscataway, NJ (US); Antonio Delle Torri, Saddle Brook, NJ (US)

(73) Assignee: AMERLUX LLC, Fairfield, NJ (US)

( * ) Notice: Subject to any disclaimer, the term of this patent is extended or adjusted under 35 U.S.C. 154(b) by 218 days.

(21) Appl. No.: 13/667,184

(22) Filed: Nov. 2, 2012

(65) Prior Publication Data

US 2014/0120756 A1 May 1, 2014

Related U.S. Application Data

(63) Continuation of application No. PCT/US2012/062230, filed on Oct. 26, 2012.

(60) Provisional application No. 61/483,943, filed on Oct. 26, 2011.

(51) Int. Cl.

| | |
|---|---|
| ***H01R 12/00*** | (2006.01) |
| ***H05K 5/00*** | (2006.01) |
| ***H01R 9/18*** | (2006.01) |
| ***H01K 5/00*** | (2006.01) |
| *H01R 25/14* | (2006.01) |
| *F21V 23/06* | (2006.01) |
| *F21Y 101/02* | (2006.01) |

(52) U.S. Cl.

CPC .................. *H01R 9/18* (2013.01); *H01R 12/00* (2013.01); *H01K 5/00* (2013.01); *H01R 25/147* (2013.01); *F21V 23/06* (2013.01); *F21Y 2101/02* (2013.01)

(58) Field of Classification Search

USPC ........... 439/56.55, 214, 620.09, 59, 489, 499, 439/441, 699.1, 387, 76.1; 362/249.02, 362/646, 382, 800; 361/752, 753, 736; 257/81, 84, 88, 95, 918

See application file for complete search history.

(56) References Cited

U.S. PATENT DOCUMENTS

| | | | | |
|---|---|---|---|---|
| 6,270,355 | B1 * | 8/2001 | Kihara | 439/56 |
| 7,322,828 | B1 * | 1/2008 | Chiang | 439/56 |
| 7,828,557 | B2 * | 11/2010 | Vogt et al. | 439/56 |
| 7,892,022 | B2 * | 2/2011 | Mostoller et al. | 439/507 |
| 2010/0072505 | A1 | 3/2010 | Gingrich, III | |
| 2011/0073891 | A1 * | 3/2011 | Yen | 257/98 |
| 2012/0051052 | A1 * | 3/2012 | Wagatsuma et al. | 362/249.01 |
| 2014/0179139 | A1 * | 6/2014 | Tanaka et al. | 439/226 |

FOREIGN PATENT DOCUMENTS

| | | | |
|---|---|---|---|
| DE | 102005017120 | A1 | 10/2006 |
| EP | 2 045 519 | A1 | 4/2009 |
| EP | 2 216 858 | A2 | 8/2010 |

OTHER PUBLICATIONS

International Search Report and Written Opinion with Notification of Transmittal for related international application No. PCT/US2012/062230, mailed: Feb. 21, 2013.

* cited by examiner

*Primary Examiner* — Abdullah Riyami
*Assistant Examiner* — Harshad Patel
(74) *Attorney, Agent, or Firm* — Day Pitney LLP

(57) ABSTRACT

Connectors for a lighting board are disclosed, adapted for receiving electrical energy from a power source, and via one or more conductive fasteners, both mechanically connecting a lighting board to a lighting frame and transmitting power from a power source into electrical contacts in a lighting board to power a lighting board.

23 Claims, 8 Drawing Sheets

LED CONNECTOR

CROSS-REFERENCE TO RELATED APPLICATIONS

This patent application claims the benefit of priority to and is a continuation of International Patent Application No. PCT/US2012/62230, filed Oct. 26, 2012, which in turn claims the benefit of priority to U.S. Provisional Patent Application 61/551,612 for an LED CONNECTOR, filed on Oct. 26, 2011. The disclosure of each of the aforementioned patent applications is incorporated herein by reference in its entirety for any purpose whatsoever.

BACKGROUND

1. Field of the Disclosed Embodiments

The disclosed embodiments relate to LED connectors that are adapted for receiving electrical energy from a power source, and mounting an LED light source to a lighting board via conductive fasteners, whereby the LED connector transmits power from the power source and direct to the conductive fasteners, thereby powering the LED light source.

2. Background of the Disclosure

LED boards have traditionally been mounted to a lighting frame by way of soldered connections. Applicant believes that the present application provides advances over the state of the art.

SUMMARY OF THE DISCLOSED EMBODIMENTS

Advantages of the present disclosure will be set forth in and become apparent from the description that follows. Additional advantages of the disclosure will be realized and attained by the methods and systems particularly pointed out in the written description and claims hereof, as well as from the appended drawings.

Among other things, connectors for a lighting board are disclosed that are adapted for receiving electrical energy from a power source, and via one or more conductive fasteners. This can facilitate mechanically connecting a lighting board to a lighting frame and transmitting power from a power source into electrical contacts in a lighting board to power a lighting board.

Thus, in one embodiment, a connector for a lighting board is provided that is adapted for receiving electrical energy from a power source, and via one or more conductive fasteners. The connector can both mechanically connect a lighting board to a lighting frame and transmit power from a power source into electrical contacts in a lighting board to power a lighting board.

In accordance with some implementations, the connector can include a central body containing first and second electrical contacts with respective positive and negative leads running through and extending away therefrom and toward the power source and a connector base capable of being seated against a first side of the lighting frame when the connector is connected to the lighting frame. The connector base can have a terminal portion which is positioned against an opening in the lighting frame when the connector is connected to the lighting frame. The connector base can include one or more members for mounting the connector to the lighting frame. The mounting member can be, for example, a first mounting wing extending in a first direction away from the body of the connector. If desired, the connector base can include a second wing extending away from the connector in a second direction. In such an embodiment, a first bottom surface of the first wing and a second bottom surface of the second wing can be on a common plane and form a connector base seat. The connector base seat can be positionable against the first side of the lighting frame for mounting the connector to the lighting frame.

In accordance with further aspects, the first mounting wing can extend further away from the connector base than the second mounting wing, whereby the first and second mounting wings, in a plan view thereof, can be asymmetrically disposed on the connector. The first and second wings can fit into respective first and second asymmetrically disposed tabs on a lighting frame such that a predetermined electrical polarity configuration is obtained between the connector and a lighting frame when the connector is positioned on a lighting frame. A centerline through the first and second mounting wings that extends away from the body can form a straight line, if desired. The first and second conductive contacts can include respective first and second top portions, electrically connected to respective positive and negative leads. Respective first and second bottom portions of the connector can accordingly extend to the terminal portion of the connector base to define both respective first and second fittings which are said first and second electrical contacts. The terminal portion can both mechanically receive and electrically connect with respective first and second conductive fasteners. The connector can mechanically receive and electrically connect with respective first and second electrical contacts of a lighting board. The lighting board can be mechanically secured to a lighting frame.

In further accordance with the disclosure, the first and second fittings at the terminal portion can be female threaded for receiving male threaded first and second conductive fasteners. The top of the first contact can be fused to the positive lead, and the top of the second contact can be fused to the negative lead. The terminal portion of the connector base can extend below a surface plane defined by the first and second bottom surfaces of the respective first and second wings. The terminal portion of the connector base can extend into an opening of a lighting frame and can be flush with an interior surface of a lighting frame, against which a rear surface of a lighting board can be disposed when secured to the electrical connector. An outer end of the first wing can include a first wing eyelet, and/or an outer end of the second wing can include a second wing eyelet. The first and second wing eyelets can be adapted for aligning with eyelets in respective first and second mounting tabs on a lighting frame for releasable locking of the connector to a lighting frame. The connector body can be molded plastic or other suitable material.

In yet further accordance with the disclosure, a lighting system is provided including a connector as recited herein and a lighting frame. The lighting frame can include an opening through which the terminal portion of the connector base extends, and first and second tabs which can be asymmetrically disposed about the opening for engaging respective first and second wings and releasably locking the connector thereto. The first and second mounting tabs can open towards opposing directions about the frame opening. For example, the connector can be twisted in a first direction about its center axis for obtaining a locked configuration against the first and second mounting tabs. Moreover, the connector can be twisted in a second, opposing direction about its center axis for obtaining a released configuration against the first and second mounting tabs. The opening in the lighting frame can be circular or other suitable shape, wherein the terminal portion of the connector can be capable of unobstructed twisting therein.

In accordance with a further aspect, the lighting frame can be thermally conductive, so that mechanically connecting a lighting board with first and second conductive fasteners can electrically connect a lighting board to the connector, and/or bias a lighting board to the thermally conductive surface of the lighting frame to permit and facilitate dissipation of thermal energy resulting from electrically powering a lighting board through the connector. If desired, the raised height of the terminal portion of the base of the connector can be equivalent to the thickness of a base of the lighting frame, against which a lighting board is disposed when installed. The opening and tabs can be mutually width-wise aligned on the lighting frame, and offset from a width-wise centerline of the base of the lighting frame by a first offset distance, whereby, with first and second contacts of a lighting board offset from a width-wise lighting board centerline by the first offset distance, a predetermined electrical polarity configuration can be obtained between the connector and a lighting board when the connector connects a lighting board to the lighting frame. The system can further include a lighting board, such as a LED array or LED point source.

In accordance with further aspects, the lighting system can include a connector and one or more conductive fasteners (e.g., screws) for mechanically connecting a lighting board to a lighting frame and electrically connecting a lighting board to the first and second fittings. The system can include a plurality of spaced apart connectors chained to each other via common, continuous positive and negative leads.

It is to be understood that the foregoing general description and the following detailed description are exemplary and are intended to provide further explanation of the disclosed embodiments. The accompanying drawings, which are incorporated in and constitute part of this specification, are included to illustrate and provide a further understanding of the disclosed methods and systems. Together with the description, the drawings serve to explain principles of the disclosure.

BRIEF DESCRIPTION OF THE FIGURES

Certain embodiments of the invention will be described through the use of the accompanying drawings, which are not to be considered as limiting, and in which.

DETAILED DESCRIPTION OF THE DISCLOSED EMBODIMENTS

Figure 1:
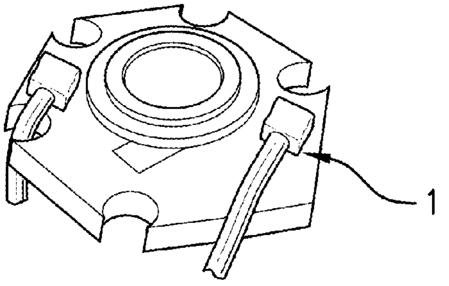
FIG.1 PRIOR ART
FIGS. 1-4 illustrate prior art connections.

In the disclosed embodiments, like elements are represented by like reference numerals.

Figure 2:
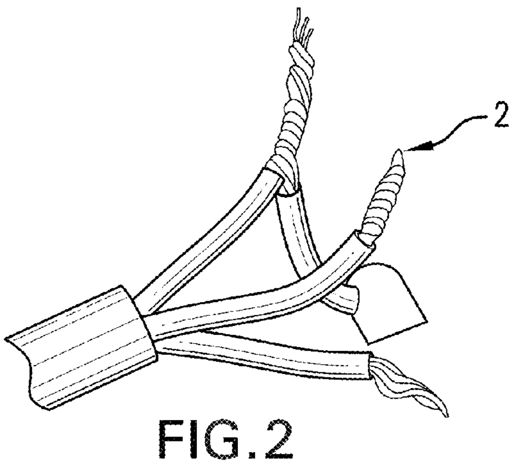
FIG.2 PRIOR ART
Figure 3:
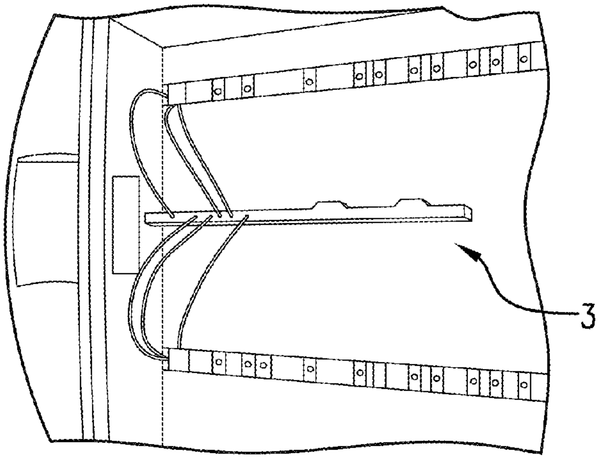
FIG.3 PRIOR ART
Figure 4:
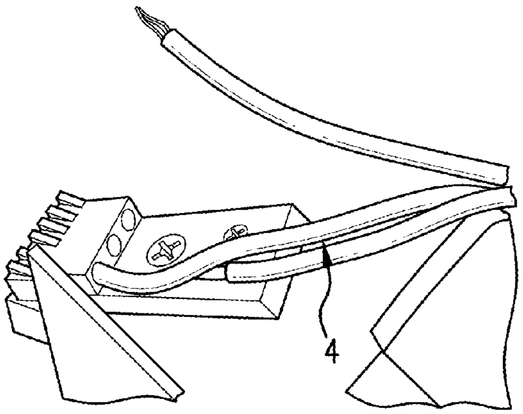
FIG.4 PRIOR ART

Applicant has appreciated that there is an unsolved need to provide a LED connector configuration that enables connecting LED boards to a lighting frame without requiring the use of soldering connections 1, as illustrated in FIG. 1, wire splicing 2 as illustrated in FIG. 2, without resulting in visible wiring 3 as illustrated in FIG. 3, and without flimsy connections 4 that can easily break as illustrated in FIG. 4.

Figure 6A:
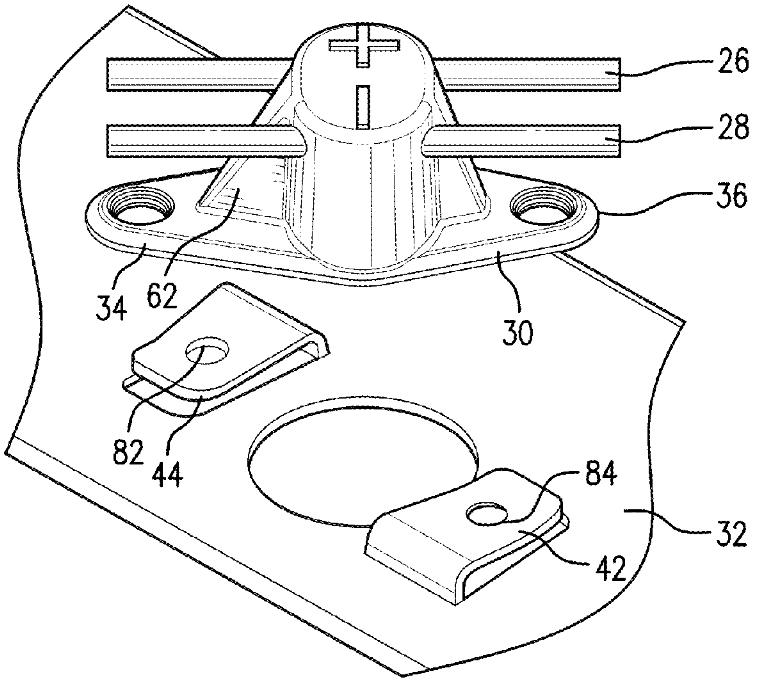
FIGS. 6A-6F illustrate the disclosed connector against a lighting frame.
Figure 6B:
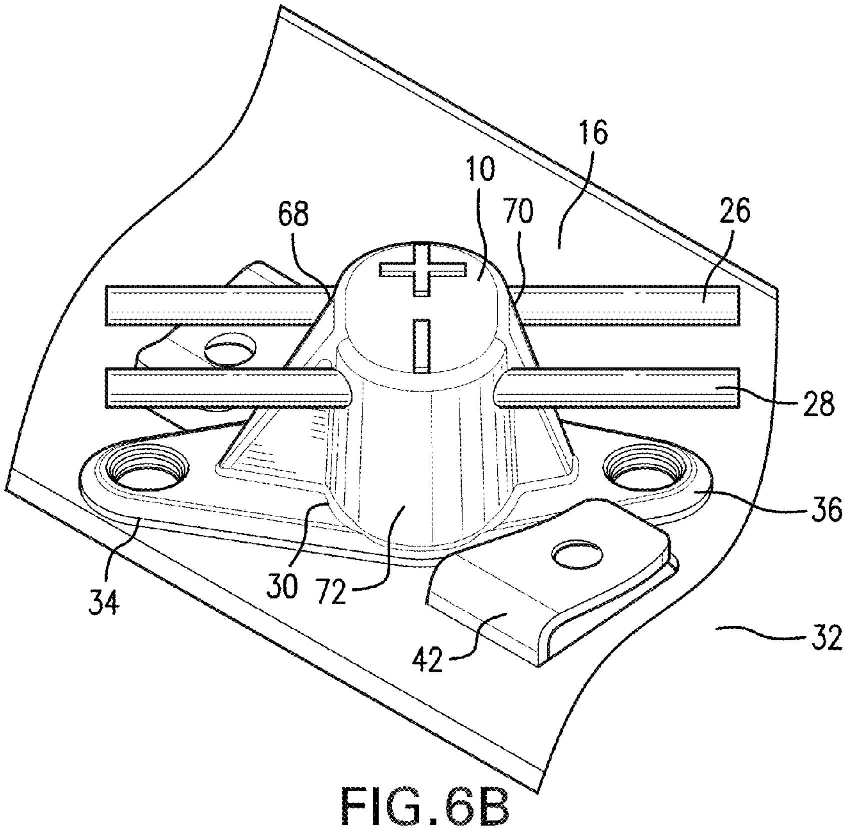
Figure 6C:
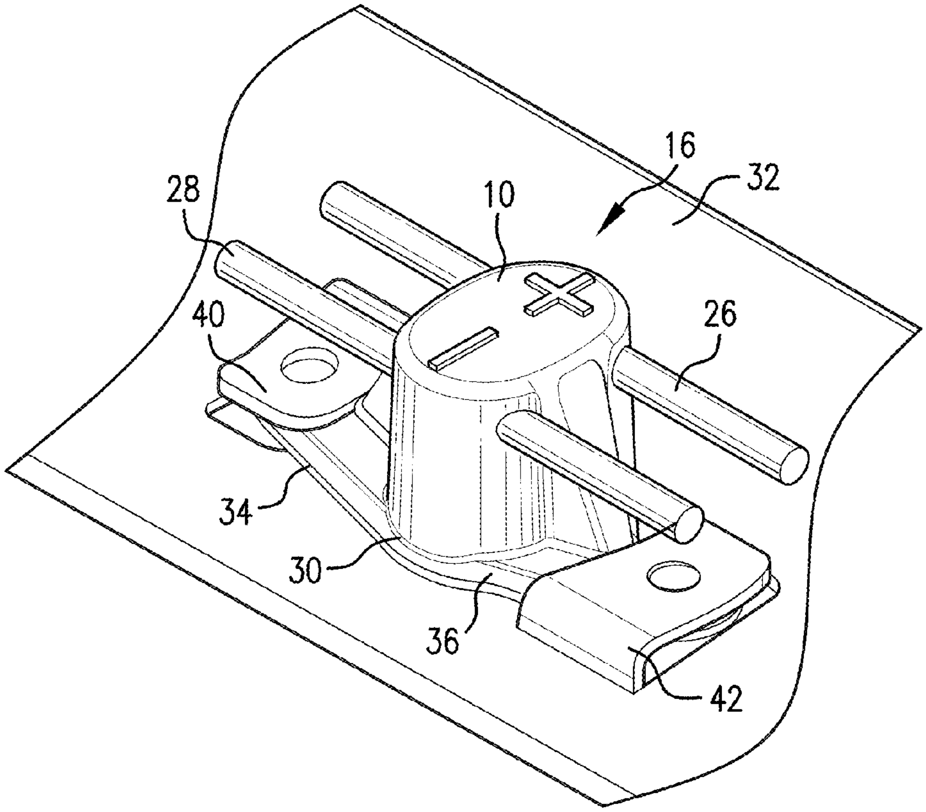
Figure 6D:
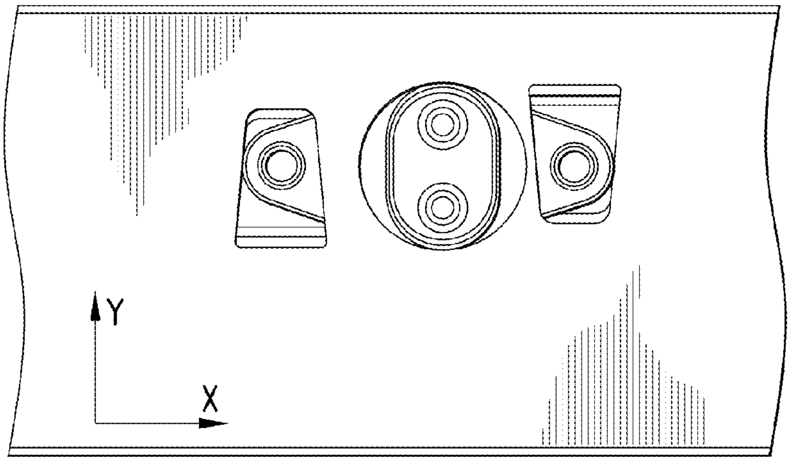
Figure 6E:
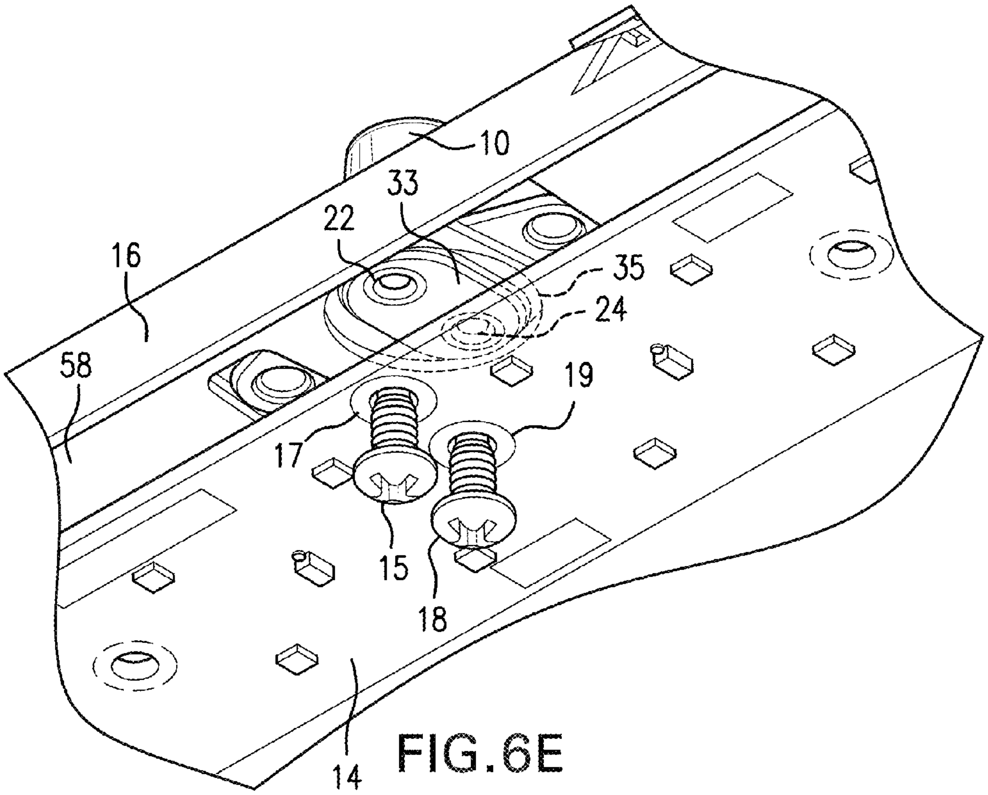
Figure 6F:
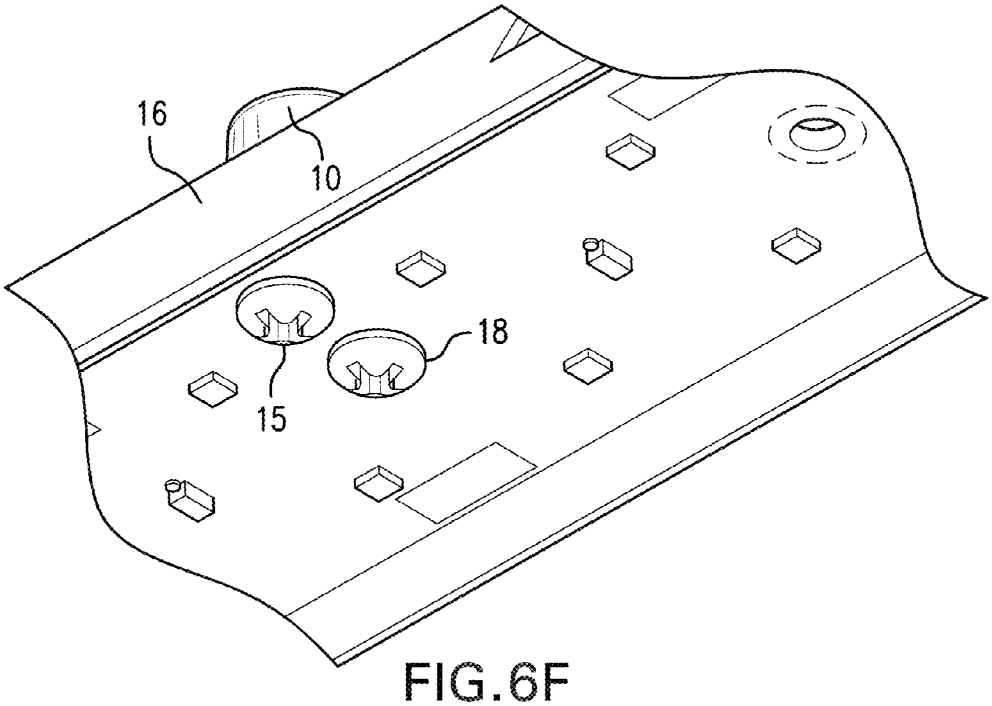

Turning to FIGS. 4A-4C and 5A-5E, a connector 10 for a lighting board 14, such as an LED lighting board, is disclosed. The connector 10 is adapted for receiving electrical energy from a power source 12 (illustrated schematically in FIG. 5A), and to facilitate mounting the lighting board 14 to a lighting frame 16 or internal base of a lighting box, via first 15 and second 18 conductive fasteners, as illustrated. From this configuration, the connector 10 both mechanically secures a lighting board 14 to a lighting frame 16, and powers a lighting board 14 via transmitting power from a power source 12 through respective first 15 and second 18 conductive fasteners and into respective first 17 and second 19 electrical contacts in a lighting board 14 (FIGS. 6E-F).

Figure 4A:
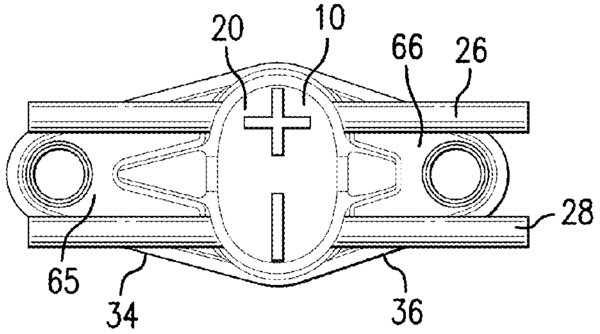
FIGS. 4A-4C illustrate an embodiment of an electrical connector in accordance with the disclosure.
Figure 4B:
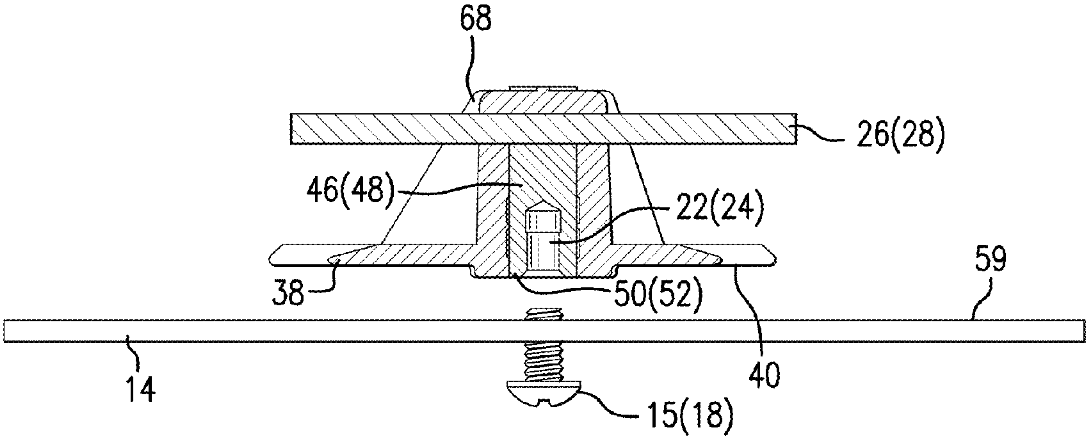
Figure 4C:
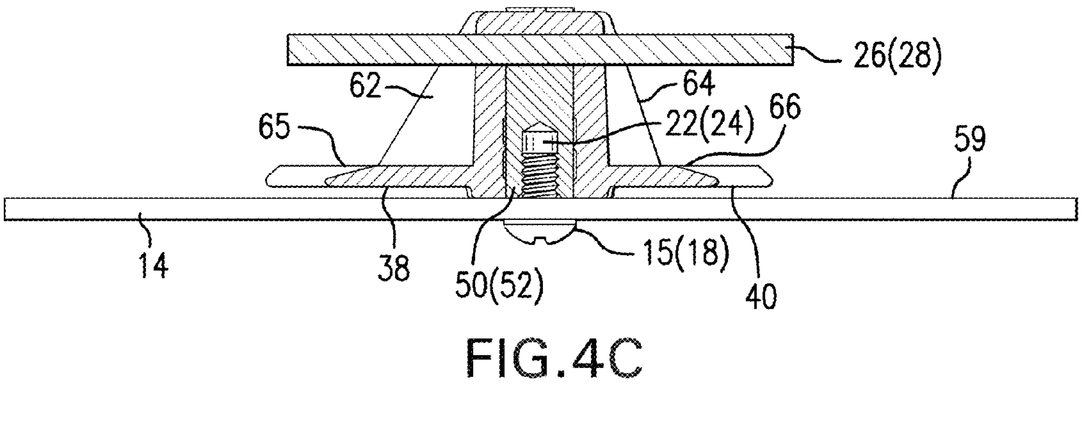
Figure 5A:
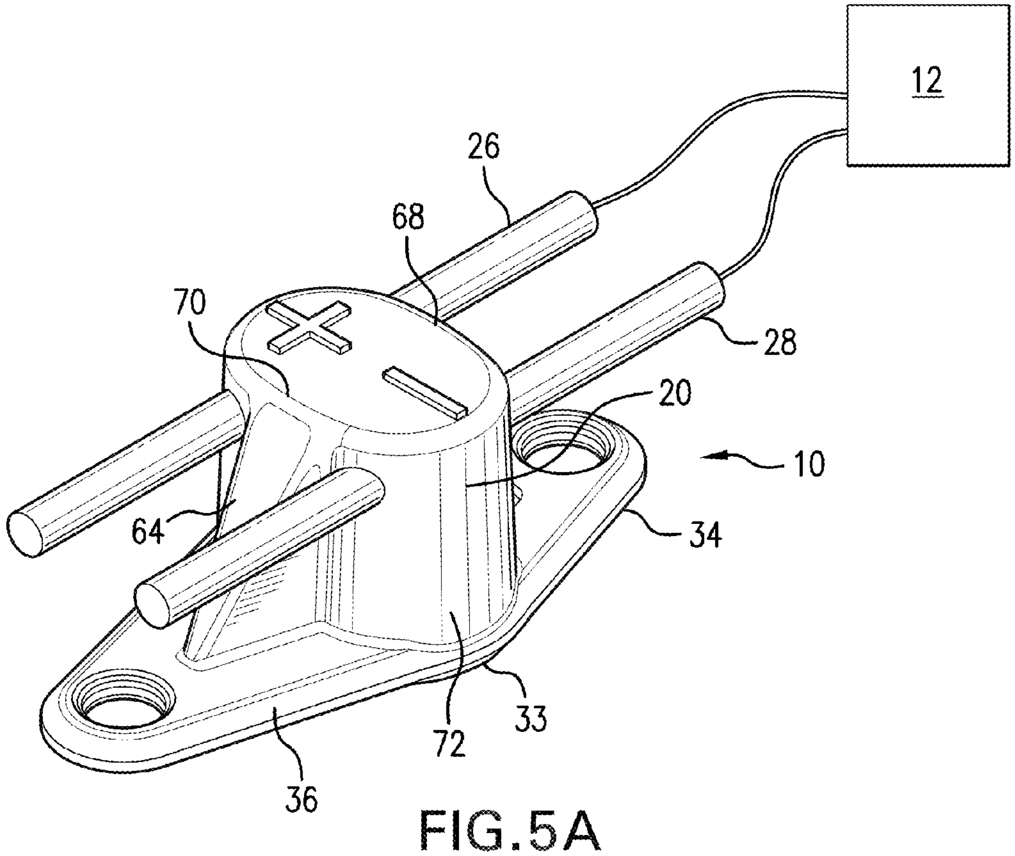
FIGS. 5A-5E illustrate further details of the illustrated electrical connector.
Figure 5B:
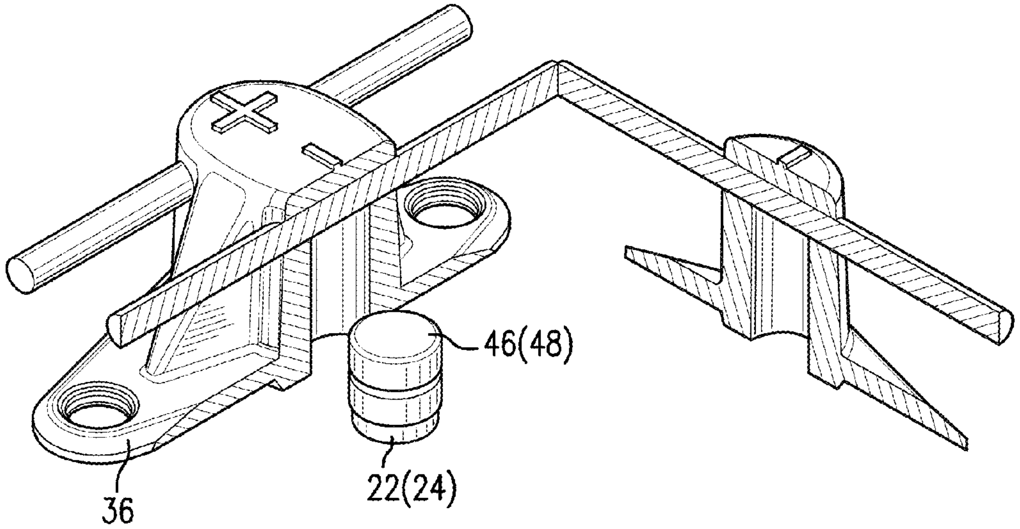
Figure 5C:
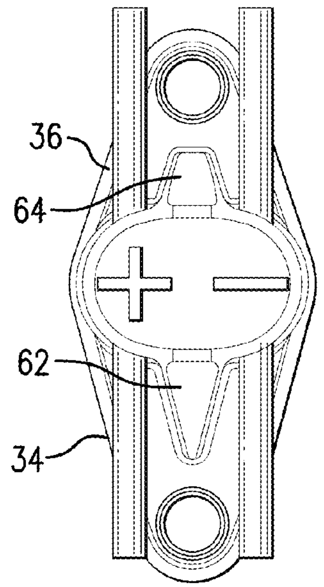
Figure 5D:
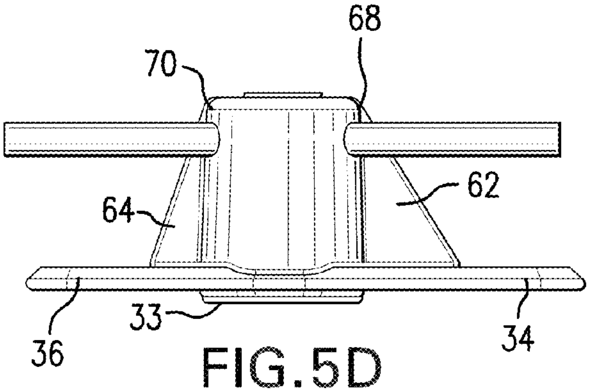
Figure 5E:
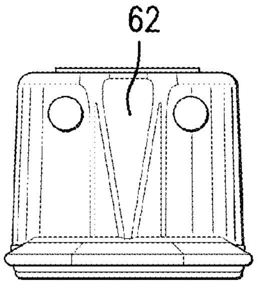

As illustrated in FIGS. 4A-4C, the electrical connector 10 includes a central body 20 containing first 22 and second 24 electrical contacts with respective positive 26 and negative 28 leads extending away therefrom and toward a power source 12. The contacts can be, for example, eighteen gauge wire, among other gages or materials.

A base 30 of the connector 10 is capable of being seated against a first side 32, that is, an outside, of a base member of a lighting frame 16 when the connector 10 is connected to the lighting frame 16. That is, the outside of a frame base forms a seat for the connector base 30.

The connector base 30 has a first portion 33 that is a terminal portion 33. The terminal portion 33 of the connector 10 is positioned against an opening 35 in a lighting frame 16 when the connector 10 is connected to a lighting frame 16.

The connector base 30 includes at least a first mounting member 34 for mounting the connector 10 to a lighting frame 16. The mounting member 34 is a first mounting wing 34 extending in a first direction away from the body 20 of the connector 10. The connector base 30 includes a second mounting wing 36 extending away from the connector 10 in a second direction.

A first bottom surface 38 of the first wing 34 and a second bottom surface 40 of the second wing 36 are on a common plane and form a connector base seat 37. The connector base seat 37 is positionable against the first side 32 of the lighting frame 16 for mounting the connector 10 to the lighting frame 16.

As illustrated, the first mounting wing 34 extends further away from a centerline of the base 30 than the second mounting wing 36. From this configuration, the first 34 and second 36 mounting wings, in a plan view thereof, are asymmetrically disposed on the connector 10. As an example, the first mounting wing 34 can be about an eighth of an inch longer, in the plan view, than the second mounting wing 36, when, for example, the tip to tip measurements of the connector is about an inch and a half.

From this configuration, the first 34 and second 36 wings fit into respective first 42 and second 44 asymmetrically disposed tabs on a lighting frame 16. As a result, a predetermined electrical polarity configuration is obtained between the connector 10 and a lighting frame 16 when the connector 10 is positioned on a lighting frame 16.

As can be appreciated by the illustration of the connector 10, a centerline through the first 34 and second 36 mounting wings that extends away from the body 20, forms a straight line that is generally parallel with an axis of the lighting frame 16.

In addition, as illustrated, the major axis of the oval shaped body 20 is perpendicular to the tip to top axis for the mounting wings 34, 36. In addition, the outer opposing tips of the mounting wings are each circular, and each tangentially connects with the major axis of the oval shaped body 20.

The first 22 and second 24 conductive contacts of the connector 10 include respective first 46 and second 48 top portions. The top portions 46, 48 of the connector 10 are electrically connected to respective positive 26 and negative 28 leads. Respective first 50 and second 52 bottom portions of the connector 10 extend to the terminal portion 33 of the base 30 to define respective both first and second fittings and the noted contacts 22, 24. With this configuration, the terminal portion 33 both mechanically receives and electrically connects with respective first 15 and second 18 conductive fasteners. Accordingly, from this configuration, the connector 10 mechanically receives and electrically connects with respective first 17 and second 19 contacts of the lighting board 14. Moreover, from this configuration, the lighting board 14 is mechanically secured to the lighting frame 16.

Additionally, the first 22 and second 24 contacts/connector fittings at the terminal portion 33 are female threaded for receiving male threaded first 15 and second 18 conductive fasteners. For example, the electrical connection between the fittings and the leads can be accomplished via, for example, a threaded, electrically conductive PEM insert, such as model number IBB-632-4, obtainable through, for example, Tower Fasteners Company, Inc., at 1690 North Ocean Avenue, Holtsville, N.Y. 11742-1823. In such an instance, the fasteners can be metallic screws or other desired fastener including a conductive portion adapted to maintain electrical continuity to permit operation of the device in operation.

Moreover, the top 46 of the first contact 22 is fused to the positive lead 26 and the top 48 of the second contact 24 is fused to the negative lead 28.

The terminal portion 33 of the base 30 extends below a surface plane defined by the first 38 and second 40 bottom surfaces of the respective first 34 and second 36 wings. From this configuration, the terminal portion 33 of the base 30 extends into an opening 35 of a lighting frame 16 and is flush with an interior surface 58 of a lighting frame 16, against which a rear surface 59 of a lighting board 14 is disposed when secured to the electrical connector 10.

The connector includes first 62 and second 64 strengthening ribs, serving as gussets. The ribs 62, 64 extend from a first top surface 65 and a second top surface 66 of respective first 34 and second 36 wings to respective first 68 and second 70 portions of a side surface 72 of the central body 20. As illustrated, the first 68 and second 70 portions of the side surface 72 of the central body 20 are opposing sides of the minor axis of the oval shaped central body 20.

An outer end of the first wing 34 includes a first wing eyelet. Additionally, an outer end of the second wing 38 includes a second wing eyelet. The first and second wing eyelets are adapted for being aligned with matching tab eyelets when positioned within respective first 42 and second 44 mounting tabs on a lighting frame 16. From this, the connector 10 is releasably locked to a lighting frame 16. It should be appreciated that while turning the connector 10 in a first direction, such as clockwise, locks the connector 10 against lighting frame tabs, and turning in the opposing direction releases the connector 10.

The body 20 of the connector 10 can be molded plastic or other suitable material. Accordingly, the process of forming the different shapes and ribs is relatively straightforward.

While the connector 10, itself, has been a focus of the present disclosure, a lighting system, as a unit, can include the electrical connector 10 and a lighting frame 16 or lighting box as indicated above. The lighting frame 16, as also indicated above, includes an opening 35 through which the terminal portion 33 of the connector base 30 extends.

The lighting frame 16 also includes the above identified first 42 and second 44 tabs which are asymmetrically disposed about the opening 35, for engaging respective first 34 and second 38 wings, and releasably locking the connector 10 thereto. The first 42 and second 44 tabs can be stamped or punched out of the lighting frame 16, which is typically formed from a metallic sheet.

The first 42 and second 44 tabs are "L" shaped brackets which open in opposing directions about the frame opening 35 as illustrated in FIGS. 6A-6D. From this, the connector 10 is twisted in a first direction about its center axis for obtaining a locked configuration against the first 42 and second 44 mounting tabs. On the other hand, the connector 10 is twisted in a second, opposing direction about its center axis for obtaining a released configuration against the first 42 and second 44 mounting tabs.

The opening 35 in the lighting frame 16 is circular. With this shape, the terminal portion 33 of the connector is capable of unobstructed twisting therein to facilitate assembly. For example, as illustrated, the terminal portion 33 can have an oval shape. If the opening 35 also had an oval shape, the twist for engaging the wings 34, 26 into respective tabs 42, 44, would be obstructed at the interface between the terminal portion 33 and the opening. By way of further example, the shape of terminal portion could alternatively be round, or any other shape adapted to rotate within circular opening 35.

The first 42 and second 44 tabs have first 82 and second 84 tab eyelets. These tab eyelets 82, 84, as indicated, are aligned with respective wing eyelets enabling releasable locking of the first 34 and second 36 wings against the lighting frame 16, using, e.g., a screw.

Figure 7:
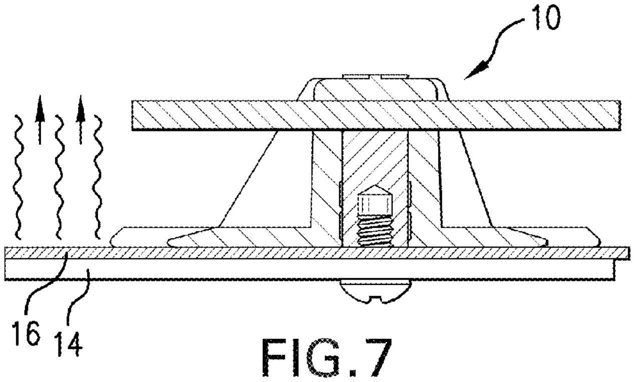
FIG. 7 illustrates a heat dissipating feature of an illustrative lighting frame in accordance with the disclosure.

According to an embodiment, the lighting frame 16 is thermally conductive, as illustrated in FIG. 7. From this configuration, mechanically connecting a lighting board 14 with first 15 and second 18 conductive fasteners achieves the following results: (i) electrically connecting a lighting board 14 to the connector 10; and (ii) biasing a lighting board 14 to the thermally conductive surface of the lighting frame 16. This configuration enables the dissipation of thermal energy resulting from electrically powering a lighting board 14 through the connector 10. In other words, the configuration creates a heat sink when an LED light source 14 is drawn flush to the lighting frame 16.

As indicated, the terminal portion 33 of the base 30 extends below a surface plane defined by the first 38 and second 40 bottom surfaces of the respective first 34 and second 36 wings. From this configuration, as illustrated in FIGS. 6D and 6E, the terminal portion 33 of the base 30 extends into an opening 35 of a lighting frame 16 and is flush with an interior surface 58 of a lighting frame 16. The raised height of the terminal portion 33 of the base 30 of the connector 10 is equivalent to the thickness of a base of the lighting frame 16, against which a lighting board 14 is disposed when installed. This assures that the PCB board forming the light source will not bend when drawn to the terminal portion 33 by the fasteners 15, 18.

Figure 8:
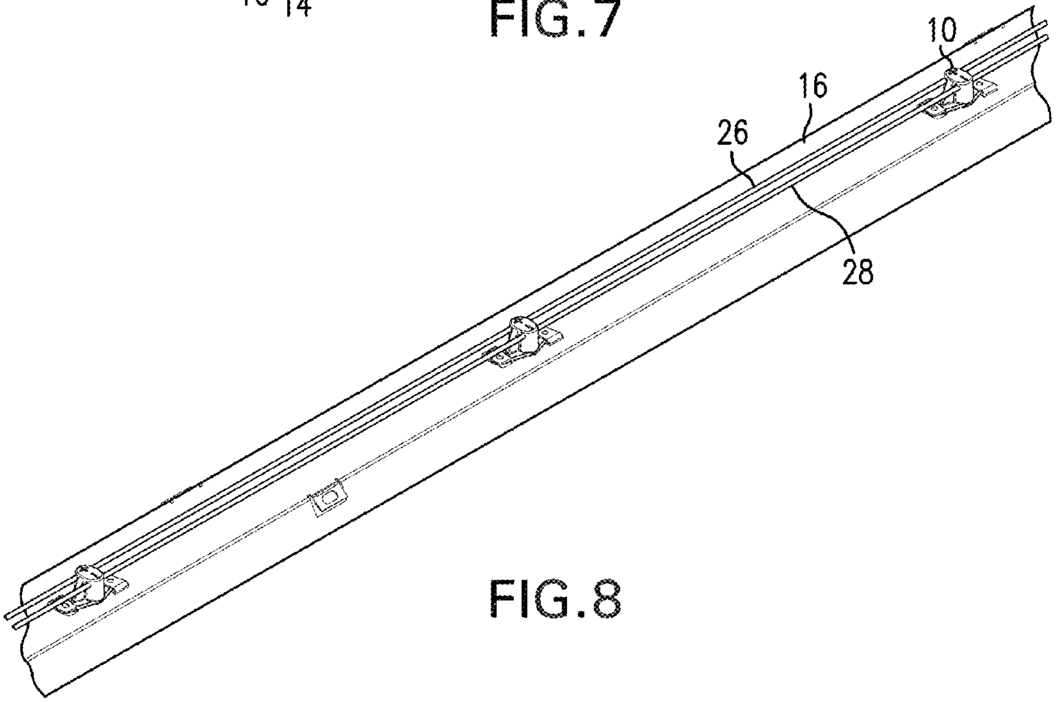
FIG. 8 illustrates a plurality of connectors on a lighting frame.

As illustrated in FIGS. 6E, 6F and 8, the opening 35 and tabs 42, 44 are mutually width-wise aligned on the lighting frame 16, and offset from a width-wise centerline of the base of the lighting frame 16 by a first offset distance. From this, with first 17 and second 19 contacts of a lighting board 14 offset from a width-wise lighting board centerline by the first offset distance, a predetermined electrical polarity configuration is obtained between the connector 10 and a lighting board 14 when the connector 10 connects a lighting board 14 to the lighting frame 16.

The system, as a unit, can also include the mentioned first 15 and second 18 conductive fasteners for mechanically and electrically connecting a lighting board 14 to the first 22 and second 24 contacts/fittings. As indicated, the first 15 and second 18 conductive fasteners are screws.

Figure 9:
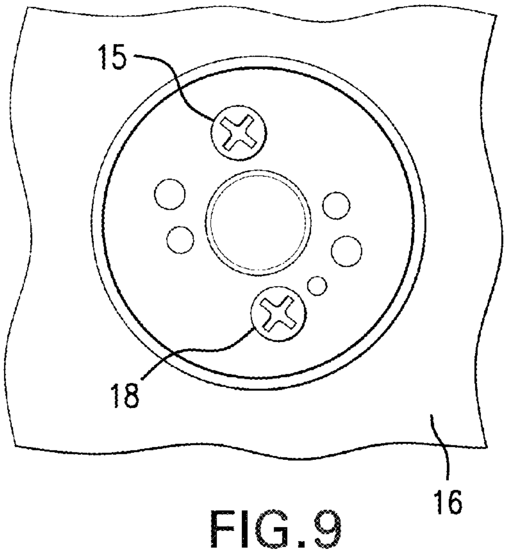
FIG. 9 illustrates a point light source installed on a lighting frame.

In addition, the system, as a unit, can include a the mentioned lighting board 14, which can be either an LED array or LED point source as illustrated in FIG. 9. As indicated and illustrated in FIG. 6E, the LED light source can include a PCB board with PCB pads 17, 19 used as contacts, which is typical for such boards. It should be noted that if the electrical connection is low voltage, there is no safety risk of touching a live connector, enabling swapping out LED boards as may be required.

It is to be appreciated that the system, as illustrated in FIG. 8, can include multiple connectors 10 in a lighting box 16, where the connectors 10 are spaced at, for example, one foot lengths. This enables securing and powering long lengths of LED boards, depending on the application.

Accordingly, a connector 10 for a lighting board 14 has been disclosed, adapted for receiving electrical energy from a power source 12, and via one or more conductive fasteners, both mechanically connecting a lighting board 14 to a lighting frame 16 and transmitting power from a power source 12 into electrical contacts in a lighting board 14 to power a lighting board 14.

The disclosed embodiments may be configured in other specific forms without departing from the spirit or essential characteristics identified herein. The embodiments are in all respects only as illustrative and not as restrictive. The scope of the embodiments is, therefore, indicated by the appended claims and their combination in whole or in part rather than by the foregoing description. All changes that come within the meaning and range of equivalency of the claims are to be embraced within their scope.

What is claimed is:

1. A connector for a lighting board, wherein the connector is configured to be attached to a rear side of a lighting board, the rear side being defined on a side of the lighting board opposite to a front side of the lighting board including at least one LED light disposed thereon, wherein the connector is configured to be attached in a matter without obstructing light cast by the one or more LED lights, the connector being adapted to conduct electrical energy from a power source through at least one conductive fastener that mechanically connects the connector to the lighting board.

2. The connector of claim 1, comprising:
- a central body containing first and second electrical contacts with respective positive and negative leads running through and extending away therefrom and toward the power source;
- a connector base capable of being seated against a first side of a lighting frame when the connector is connected to the lighting frame; and
- the connector base having a terminal portion which is positioned against an opening in the lighting frame when the connector is connected to the lighting frame.

3. The connector of claim 2, wherein:
- the connector base includes at least a first mounting member for mounting the connector to the lighting frame.

4. The connector of claim 3, wherein:
- the mounting member is a first mounting wing extending in a first direction away from the body of the connector; and
- the connector base includes a second mounting wing extending away from the connector in a second direction,
- wherein a first bottom surface of the first mounting wing and a second bottom surface of the second mounting wing are on a common plane and form a connector base seat; and
- the connector base seat being positionable against the first side of the lighting frame for mounting the connector to the lighting frame.

5. The connector of claim 4, wherein:
- the first mounting wing extends further away from the connector base than the second mounting wing, whereby the first and second mounting wings, in a plan view thereof, are asymmetrically disposed on the connector;
- whereby the first and second mounting wings fit into respective first and second asymmetrically disposed tabs on a lighting frame such that a predetermined electrical polarity configuration is obtained between the connector and a lighting frame when the connector is positioned on a lighting frame.

6. The connector of claim 4, wherein a centerline through the first and second mounting wings that extends away from the body, forms a straight line.

7. The connector of claim 4, where:
- the terminal portion of the connector base extends below a surface plane defined by the first and second bottom surfaces of the respective first and second mounting wings;
- whereby the terminal portion of the connector base extends into an opening of the lighting frame and is flush with an interior surface of the lighting frame, against which a rear surface of the lighting board is disposed when secured to the connector.

8. The connector of claim 4, where:
- an outer end of the first mounting wing includes a first wing eyelet, and an outer end of the second mounting wing includes a second wing eyelet;
- the first and second wing eyelets are adapted for aligning with eyelets in respective first and second mounting tabs on the lighting frame for releasable locking of the connector to the lighting frame.

9. The connector of claim 4, wherein the central body is molded plastic.

10. The connector of claim 3, wherein the first and second conductive contacts include:
- respective first and second top portions, electrically connected to respective positive and negative leads; and
- respective first and second bottom portions of the connector extend to the terminal portion of the connector base to define both respective first and second fittings which are said first and second electrical contacts;
- whereby:
  - (i) the terminal portion both mechanically receives and electrically connects with respective first and second conductive fasteners; and
  - (ii) the connector mechanically receives and electrically connects with respective first and second electrical contacts of the lighting board, thereby mechanically securing the lighting board to the lighting frame.

11. The connector of claim 10, wherein the first and second fittings at the terminal portion are female threaded for receiving male threaded first and second conductive fasteners.

12. The connector of claim 10, where:
- the top of the first contact is fused to the positive lead; and
- the top of the second contact is fused to the negative lead.

13. A lighting system including the connector of claim 10, and first and second conductive fasteners for mechanically connecting the lighting board to the lighting frame and electrically connecting the lighting board to the first and second fittings.

14. The system of claim 13, where the first and second conductive fasteners are screws.

15. The system claim 13, including plural connectors chained via common, continuous positive and negative leads.

16. A lighting system, comprising:

a lighting board;

a lighting frame, wherein the lighting frame includes:

an opening; and first and second tabs which are asymmetrically disposed about the opening for engaging respective first and second mounting wings and releasably locking the connector thereto; and a connector, wherein the connector is attached to the rear side of a lighting board, on the side opposite one or more LED lights without obstructing light cast by the one or more LED lights, the connector adapted for receiving electrical energy from a power source, and via one or more conductive fasteners, both mechanically connecting the lighting board to the lighting frame and transmitting power from the power source into electrical contacts in the lighting board to power the lighting board without additional electrical connection, wherein the connector includes:

a central body containing first and second electrical contacts with respective positive and negative leads running through and extending away therefrom and toward the power source; and a connector base capable of being seated against a first side of the lighting frame when the connector is connected to the lighting frame, and having a terminal portion which is positioned against and extends through an opening in the lighting frame when the connector is connected to the lighting frame.

17. The system of claim 16, where the first and second mounting tabs open towards opposing directions about the frame opening, whereby:

the connector is twisted in a first direction about its center axis for obtaining a locked configuration against the first and second mounting tabs; and the connector is twisted in a second, opposing direction about its center axis for obtaining a released configuration against the first and second mounting tabs.

18. The system of claim 17, where the opening in the lighting frame is circular, whereby the terminal portion of the connector is capable of unobstructed twisting therein.

19. The system of claim 16, wherein the lighting frame is thermally conductive, so that:

mechanically connecting the lighting board with first and second conductive fasteners: (i) electrically connects the lighting board to the connector; and (ii) biases the lighting board to the thermally conductive surface of the lighting frame;

thereby enabling dissipation of thermal energy resulting from electrically powering the lighting board through the connector.

20. The system of claim 16, wherein:

the raised height of the terminal portion of the base of the connector is equivalent to the thickness of a base of the lighting frame, against which the lighting board is disposed when installed.

21. The system of claim 16, wherein:

the opening and tabs are mutually width-wise aligned on the lighting frame, and offset from a width-wise centerline of the base of the lighting frame by a first offset distance;

whereby, with first and second contacts of a lighting board offset from a width-wise lighting board centerline by the first offset distance, a predetermined electrical polarity configuration is obtained between the connector and a lighting board when the connector connects the lighting board to the lighting frame.

22. The system of claim 16, wherein the lighting board is an LED array.

23. The system of claim 16, wherein the lighting board is an LED point source.

* * * * *